US012757537B2

(12) United States Patent
Chang et al.

(10) Patent No.: US 12,757,537 B2
(45) Date of Patent: Oct. 6, 2026

(54) DISPLAY DEVICE RELATED TO micro-LED AND MANUFACTURING METHOD THEREFOR

(71) Applicant: LG ELECTRONICS INC., Seoul (KR)

(72) Inventors: Wonjae Chang, Seoul (KR); Bongchu Shim, Seoul (KR); Gunho Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 1154 days.

(21) Appl. No.: 17/784,271

(22) PCT Filed: Jan. 31, 2020

(86) PCT No.: PCT/KR2020/001494
§ 371 (c)(1),
(2) Date: Jun. 10, 2022

(87) PCT Pub. No.: WO2021/117979
PCT Pub. Date: Jun. 17, 2021

(65) Prior Publication Data

US 2023/0059135 A1 Feb. 23, 2023

(30) Foreign Application Priority Data

Dec. 11, 2019 (KR) ........................ 10-2019-0164326

(51) Int. Cl.
*H10H 20/85* (2025.01)
*H10W 90/00* (2026.01)
*H10H 20/824* (2025.01)

(52) U.S. Cl.
CPC ........ *H10H 20/8506* (2025.01); *H10W 90/00* (2026.01); *H10H 20/824* (2025.01)

(58) Field of Classification Search
CPC .......................... H10H 20/8506; H10W 90/00
See application file for complete search history.

(56) References Cited

U.S. PATENT DOCUMENTS

2013/0214302 A1* 8/2013 Yeh ..................... H01L 25/0753 438/27

FOREIGN PATENT DOCUMENTS

EP 4012769 A1 6/2022
EP 4020568 A1 6/2022
(Continued)

*Primary Examiner* — Suberr L Chi
(74) *Attorney, Agent, or Firm* — Birch, Stewart, Kolasch & Birch, LLP

(57) ABSTRACT

A method for manufacturing a display device related to a micro-light-emitting diode (micro-LED) according to an embodiment of the present disclosure comprises the steps of: moving an assembly device comprising a magnetic body, while the assembly device is in contact or not in contact with an assembly substrate (a chamber filled with fluid is positioned below the assembly device and the assembly substrate, wherein a plurality of specific semiconductor light-emitting diodes are included in the chamber); on the basis of a magnetic field generated by the assembly device, moving the plurality of specific semiconductor light-emitting diodes in the chamber in a direction in which the assembly substrate is positioned; arranging, in first-type assembly grooves in the assembly substrate, a first group of semiconductor light-emitting diodes from among the plurality of specific semiconductor light-emitting diodes; and arranging, in second-type assembly grooves in the assembly substrate, a second group of semiconductor light-emitting diodes from among the plurality of specific semiconductor light-emitting diodes.

13 Claims, 21 Drawing Sheets

(56) References Cited

FOREIGN PATENT DOCUMENTS

| | | | |
|---|---|---|---|
| EP | 4024460 | A1 | 7/2022 |
| KR | 10-2013-0133142 | A | 12/2013 |
| KR | 10-2018-0030454 | A | 3/2018 |
| KR | 10-2019-0085892 | A | 7/2019 |
| KR | 10-2019-0095638 | A | 8/2019 |
| KR | 10-2019-0099164 | A | 8/2019 |
| KR | 10-2019-0104276 | A | 9/2019 |
| KR | 10-2019-0106885 | A | 9/2019 |
| KR | 10-2019-0126260 | A | 11/2019 |

* cited by examiner (a)

(b)

(a) (b) (c) (d) (e)

(a) (b) (c) (d)

DISPLAY DEVICE RELATED TO micro-LED AND MANUFACTURING METHOD THEREFOR

CROSS REFERENCE TO RELATED APPLICATIONS

This application is the National Stage filing under 35 U.S.C. 371 of International Application No. PCT/KR2020/001494, filed on Jan. 31, 2020, which claims the benefit of earlier filing date and right of priority to Korean Application No. 10-2019-0164326, filed on Dec. 11, 2019, the entire contents of all these applications are hereby expressly incorporated by reference into the present application.

TECHNICAL FIELD

The present disclosure relates to technology related to a display device, and more particularly to a display device using a micro-light emitting diode (micro-LED) and a manufacturing method thereof.

BACKGROUND ART

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

In order to implement a display device using such semiconductor light emitting elements, a very large number of semiconductor light emitting elements are required. Therefore, in consideration of manufacturing costs, the size of a separate semiconductor light emitting element needs to be miniaturized to increase the number of semiconductor light emitting elements to be produced on a substrate of the same area. In this way, a semiconductor light emitting element having a miniaturized size is also called a micro LED in recent years.

However, in a process of producing or assembling a micro LED chip, there may be a chip physically damaged. As for the damaged chip, it is necessary to separate the chip in advance before assembling the chip on a final display substrate to increase an assembly rate.

However, conventionally, there is no method of separating or recovering the physically damaged micro LED chip before assembling the chip on the final substrate.

In particular, in the case of a display device that requires an assembly rate of 6 N (nano) or higher, defective chips are allowed only at 99.9999% or less, and therefore, even when one or two defective chips are present in a final substrate, a problem is expected in that 6N (nano) requirements are not satisfied.

DISCLOSURE

Technical Problem

An object of an embodiment of the present disclosure is to provide a technology for selectively separating only a defective chip before a micro-light emitting diode (micro-LED)-related chip is assembled on a final substrate.

Another object of an embodiment of the present disclosure is to improve an assembly rate of a red chip that is manufactured based on GaAs and is easily damaged.

Another object of an embodiment of the present disclosure is to provide an optimum assembly groove and assembly electrode for recovering a defective chip.

Further, another object of the present disclosure is to solve various problems not mentioned herein. Those skilled in the art will appreciate the embodiments of the present disclosure through the description and drawings to be described later.

Technical Solution

According to an embodiment of the present disclosure, a method of manufacturing a display device related to a micro light emitting diode (micro-LED) includes moving an assembly device including a magnetic substance to be in contact or non-contact with an assembly substrate (a chamber filled with a fluid being positioned below the assembly device and the assembly substrate and a plurality of specific semiconductor light emitting elements being contained in the chamber), moving the plurality of specific semiconductor light emitting elements in the chamber toward a side at which the assembly substrate is positioned, based on a magnetic field generated by the assembly device, arranging semiconductor light emitting elements of a first group among the plurality of specific semiconductor light emitting elements in a first type assembly groove within the assembly substrate, and arranging semiconductor light emitting elements of a second group among the plurality of specific semiconductor light emitting elements in a second type assembly groove within the assembly substrate. For example, the second type assembly groove may be different from the first type assembly groove.

According to another embodiment, a radius of the second type assembly groove may be smaller than a radius of the first type assembly groove.

According to another embodiment, the semiconductor light emitting elements of the first group may not be arranged in the second type assembly groove, and the semiconductor light emitting elements of the second group may be arranged in the second type assembly groove.

According to another embodiment, arrangement of an assembly electrode for the first type assembly groove may be different from arrangement for an assembly electrode for the second type assembly groove.

According to another embodiment, the assembly electrode for the first type assembly groove may partially overlap the first type assembly groove to generate first dielectrophoresis (DEP) force, and the assembly electrode for the second type assembly groove may not overlap the second type assembly groove to generate second DEP force. In particular, the second DEP force may be smaller than the first DEP force.

According to another embodiment, all of the plurality of specific semiconductor light emitting elements may correspond to a red chip manufactured based on GaAs, and the assembly substrate may correspond to a donor substrate or a final display substrate.

According to an embodiment, a display device related to a micro light emitting diode (micro-LED) includes an assembly substrate including a first type assembly groove and a second type assembly groove having a different size or structure from the first type assembly groove. For example, semiconductor light emitting elements of a first group among the plurality of specific semiconductor light emitting elements may be arranged in a first type assembly groove within the assembly substrate, and semiconductor light emitting elements of a second group among the plurality of specific semiconductor light emitting elements may be arranged in the second type assembly groove within the assembly substrate.

Advantageous Effects

According to an embodiment of the present disclosure, only a defective chip may be selectively separated before a chip related to a micro-light emitting diode (micro-LED) is assembled on a final substrate.

According to another embodiment of the present disclosure, an assembly rate of a red chip that is manufactured based on GaAs and is easily damaged may be improved.

According to another embodiment of the present disclosure, an optimum assembly groove and assembly electrode for recovering a defective chip may be provided.

According to another embodiment of the present disclosure, there may be additional technical effects that are not mentioned here. The effects may be understood by those skilled in the art through the whole spirit of the specification and drawings.

BEST MODE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like, and may be used interchangeably therewith.

Figure 1:
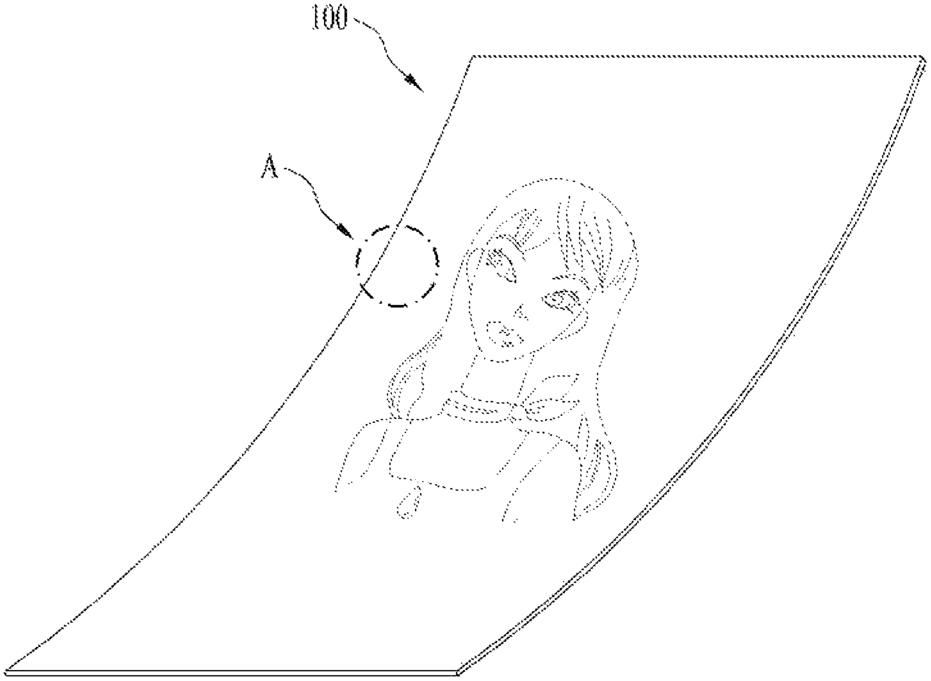
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first state is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
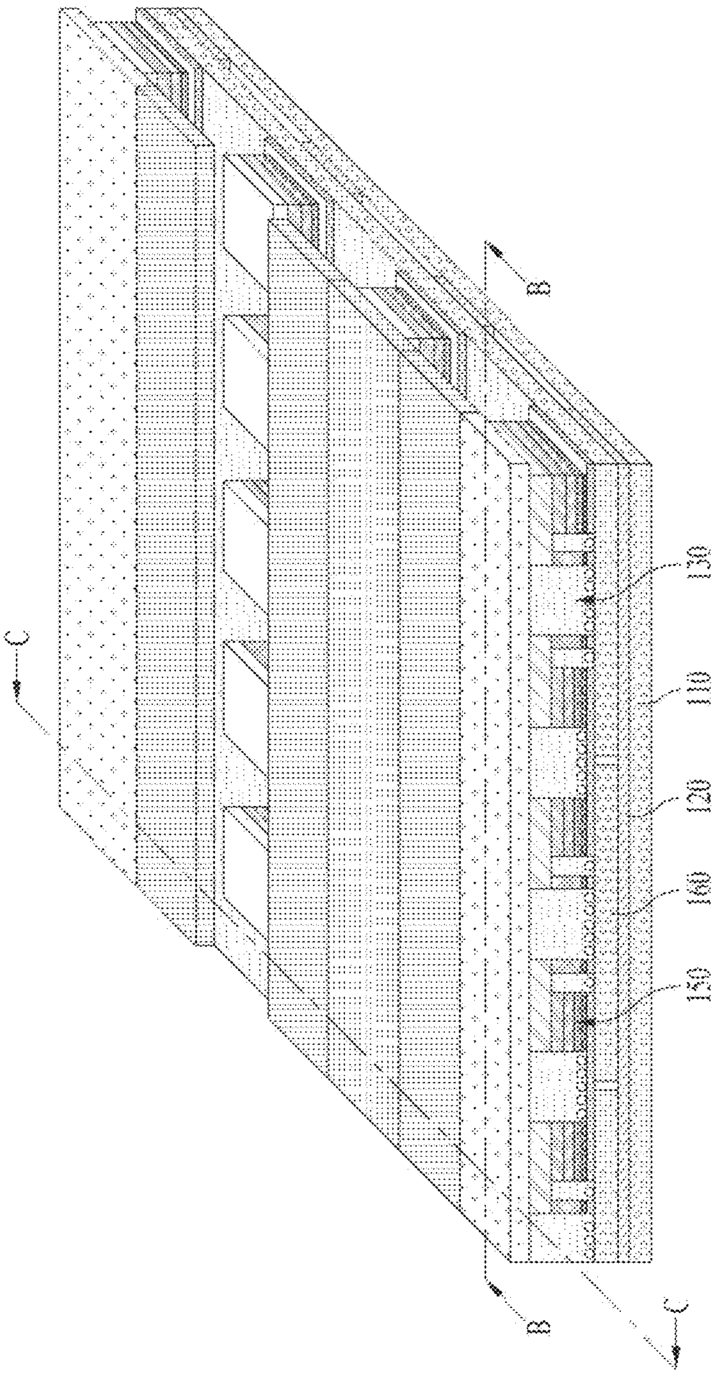
FIG. 2 is a partially enlarged diagram showing a part A shown in FIG. 1.

FIG. 2 is a partially enlarged view showing part A of FIG. 1.

Figure 3A:
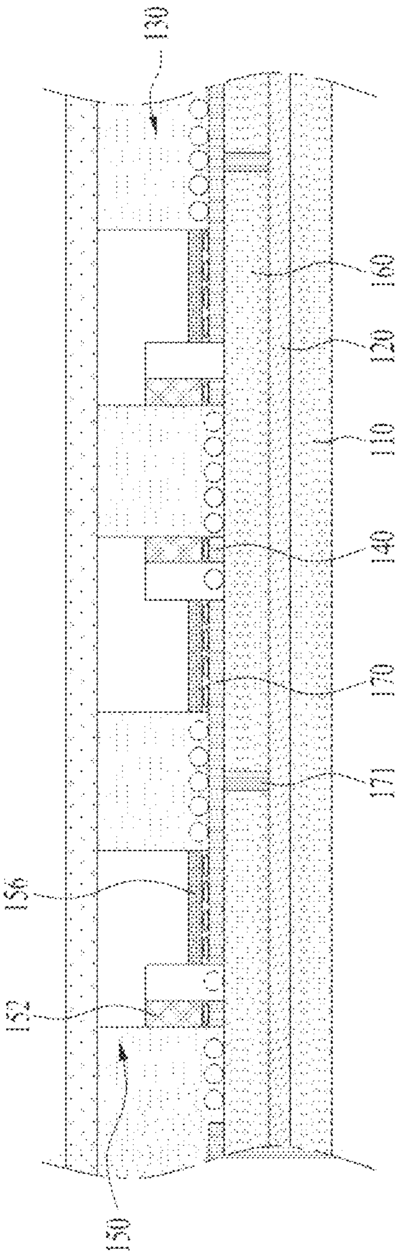
FIGS. 3A and 3B are cross-sectional diagrams taken along the cutting lines B-B and C-C in FIG. 2.
Figure 3B:
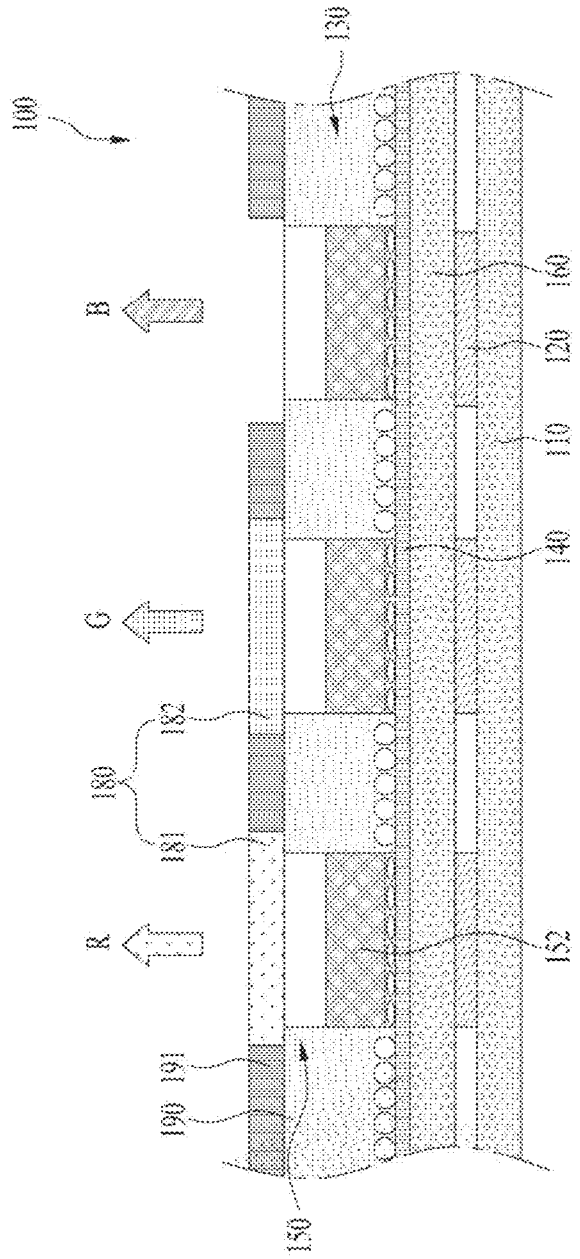

FIGS. 3A and 3B are cross-sectional views taken along lines B-B and C-C in FIG. 2.

Figure 4:
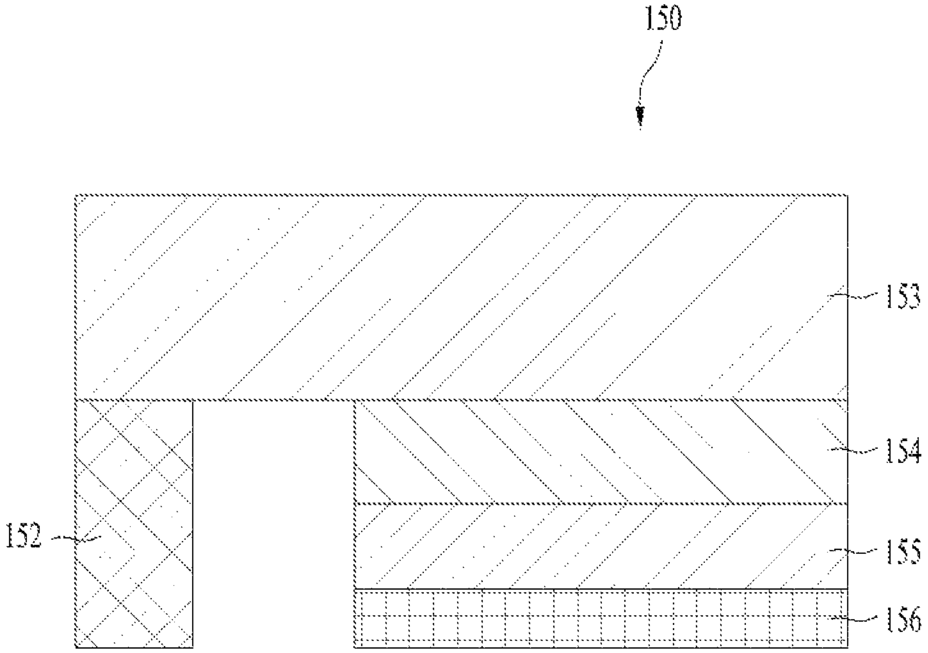
FIG. 4 is a conceptual diagram illustrating the flip-chip type semiconductor light emitting element of FIG. 3.

FIG. 4 is a conceptual view illustrating the flip-chip type semiconductor light emitting element of FIG. 3.

Figure 5A:
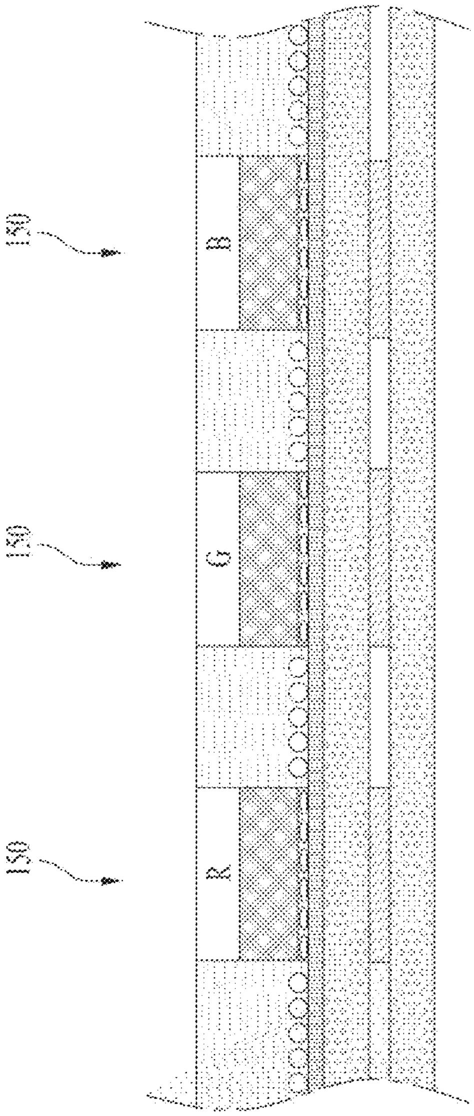
FIGS. 5A to 5C are conceptual diagrams illustrating various examples of color implementation with respect to a flip-chip type semiconductor light emitting element.
Figure 5B:
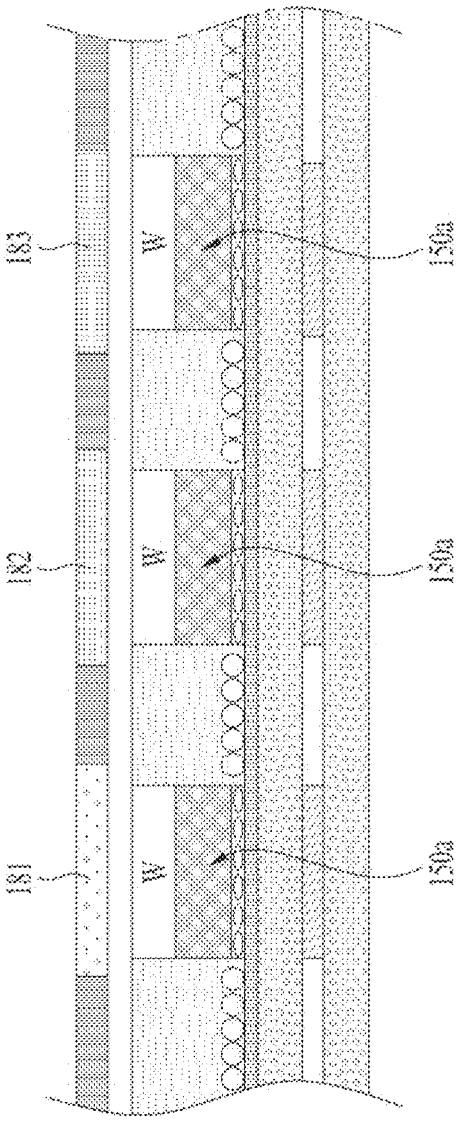
Figure 5C:
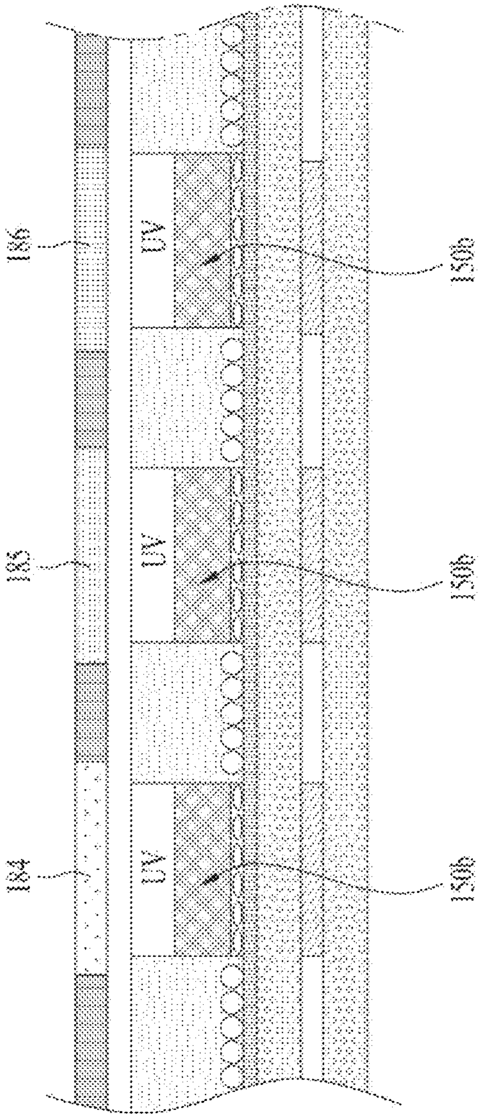

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a “conductive adhesive layer”).

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting device array, and a phosphor conversion layer 180 may be formed on the light emitting device array.

The light emitting device array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150*a* may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 184, a green phosphor conversion layer 185, and a blue phosphor conversion layer 186 may be provided on an ultraviolet light emitting device. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 μm or less, and the device may have a rectangular or square shape. When the semiconductor light emitting element has a rectangular shape, the size thereof may be less than or equal to 20 μm×80 μm.

In addition, even when a square semiconductor light emitting element having a side length of 10 μm is used as a unit pixel, sufficient brightness to form a display device may be obtained.

Therefore, for example, in case of a rectangular pixel having a unit pixel size of 600 μm×300 μm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
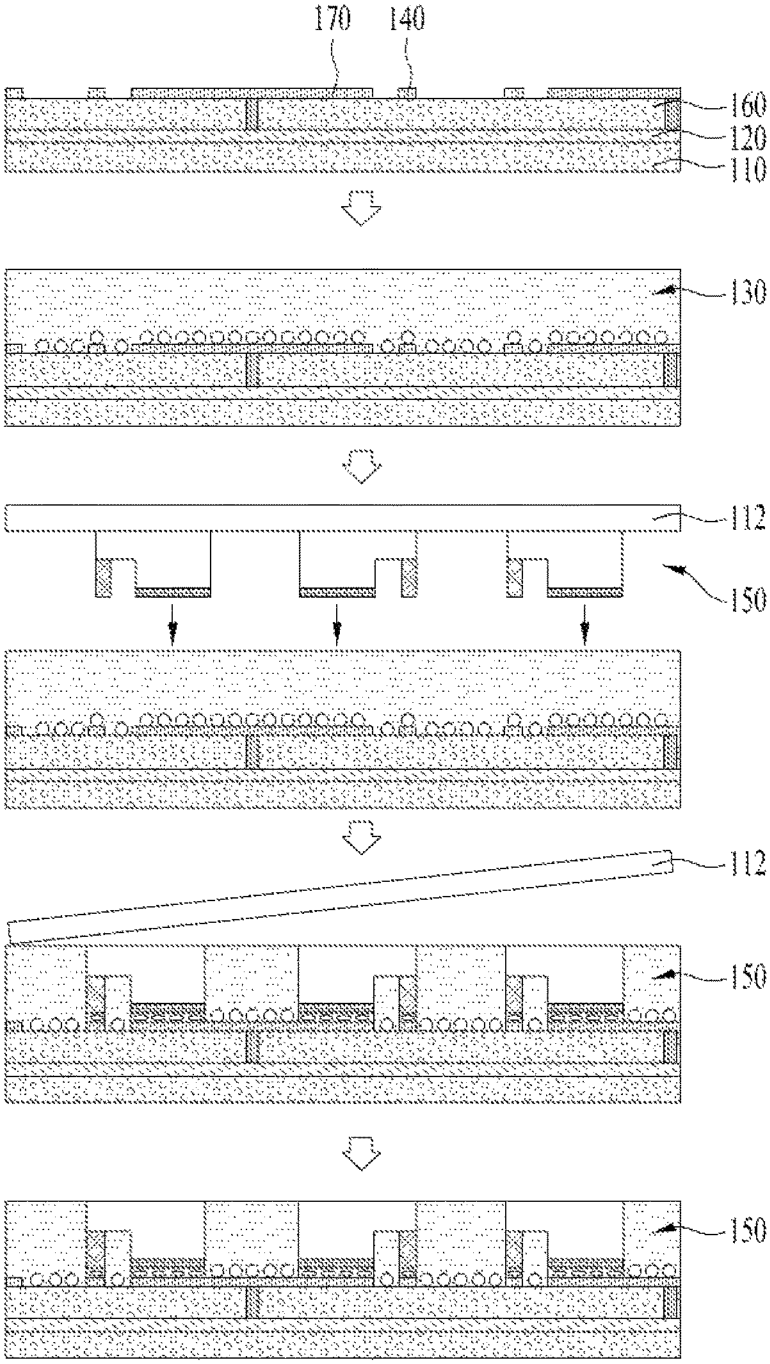
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
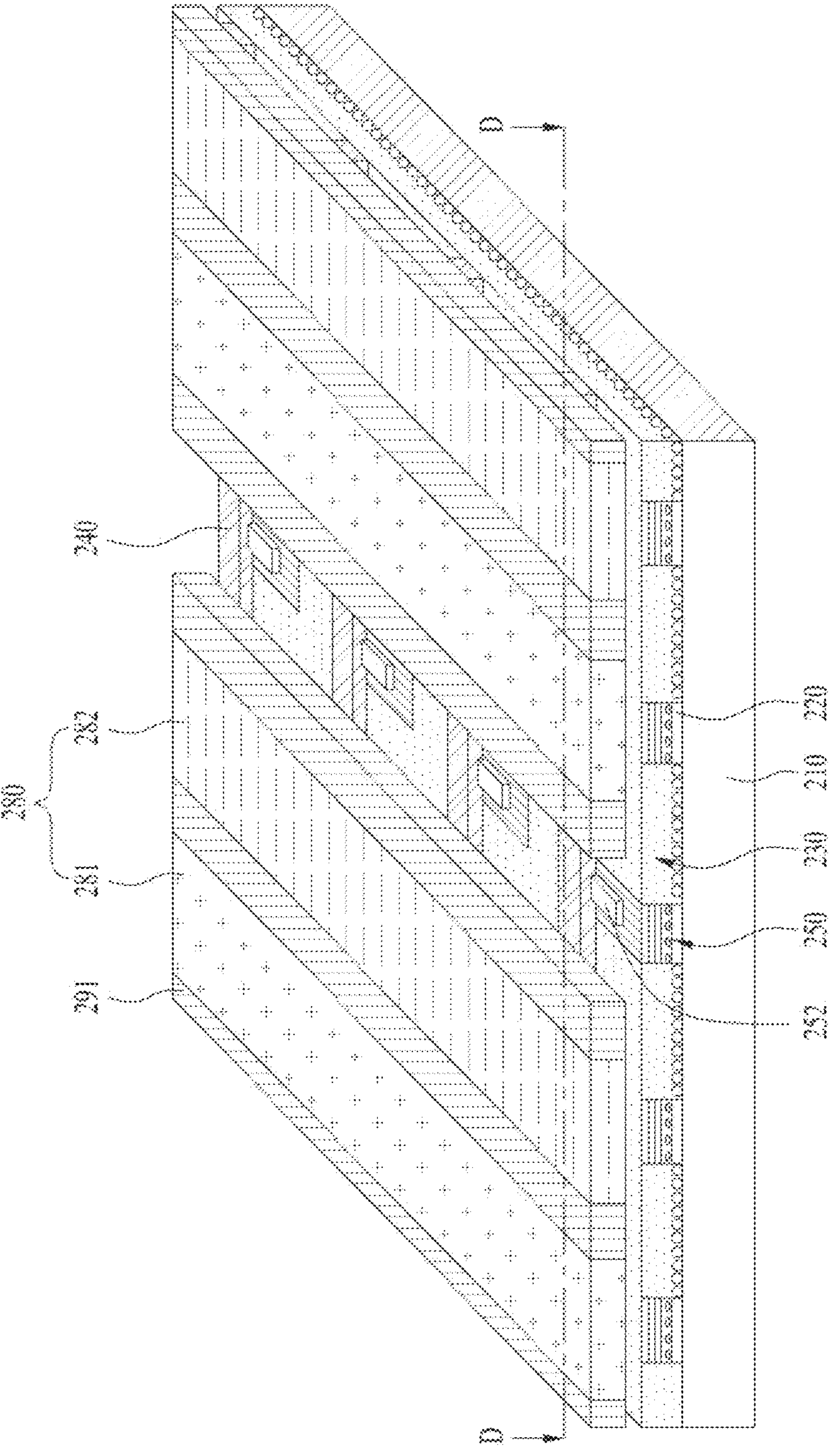
FIG. 7 is a perspective diagram of a display device using a semiconductor light emitting element according to another embodiment of the present disclosure.
Figure 8:
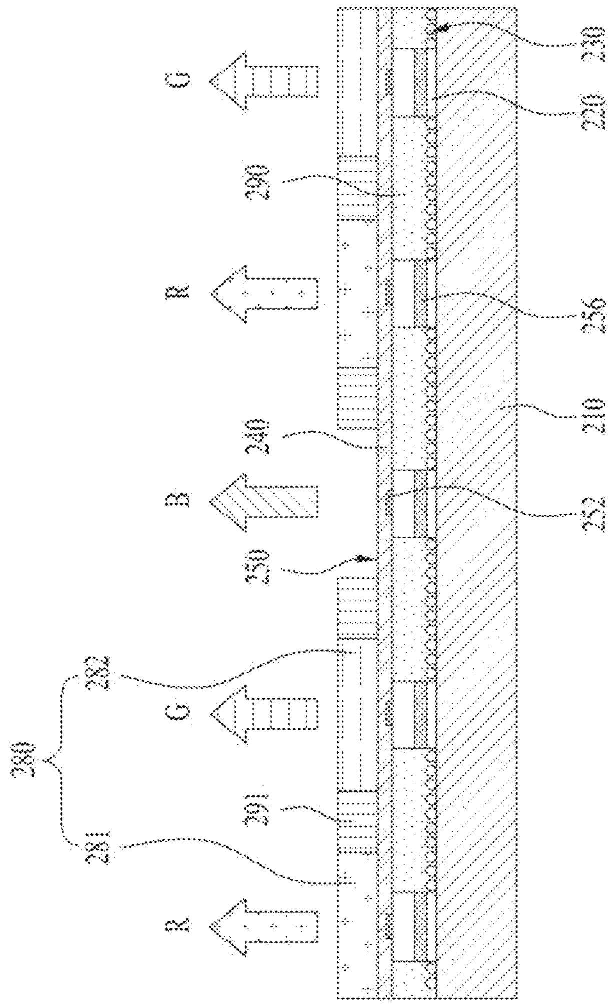
FIG. 8 is a cross-sectional diagram taken along a cutting line D-D shown in FIG. 7.
Figure 9:
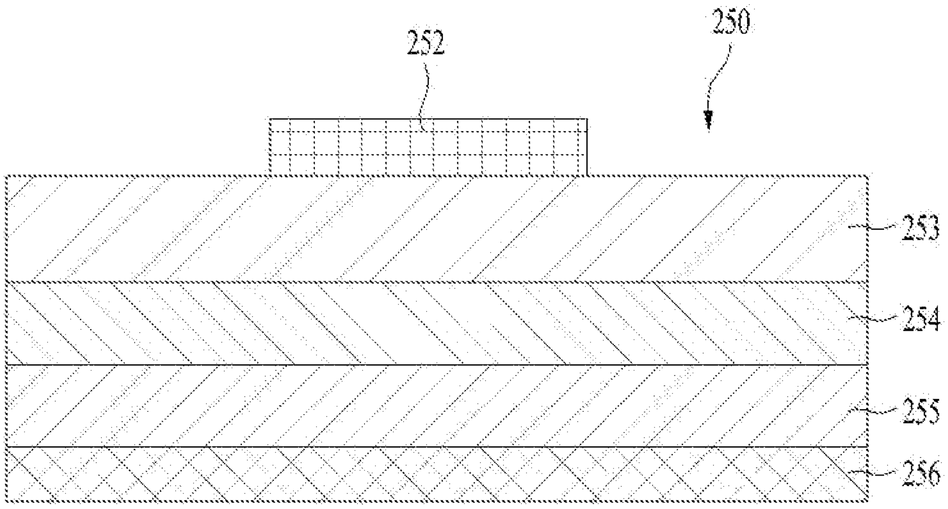
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 7, and FIG. 9 is a conceptual diagram showing a vertical type semiconductor light emitting element shown in FIG. 8.

Referring to the present drawings, a display device may employ a vertical semiconductor light emitting element of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 μm for example and the individual semiconductor light emitting element 250 may include a rectangular or square element. For example, the rectangular element may have a size equal to or smaller than 20 μm×80 μm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include an n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

Figure 10:
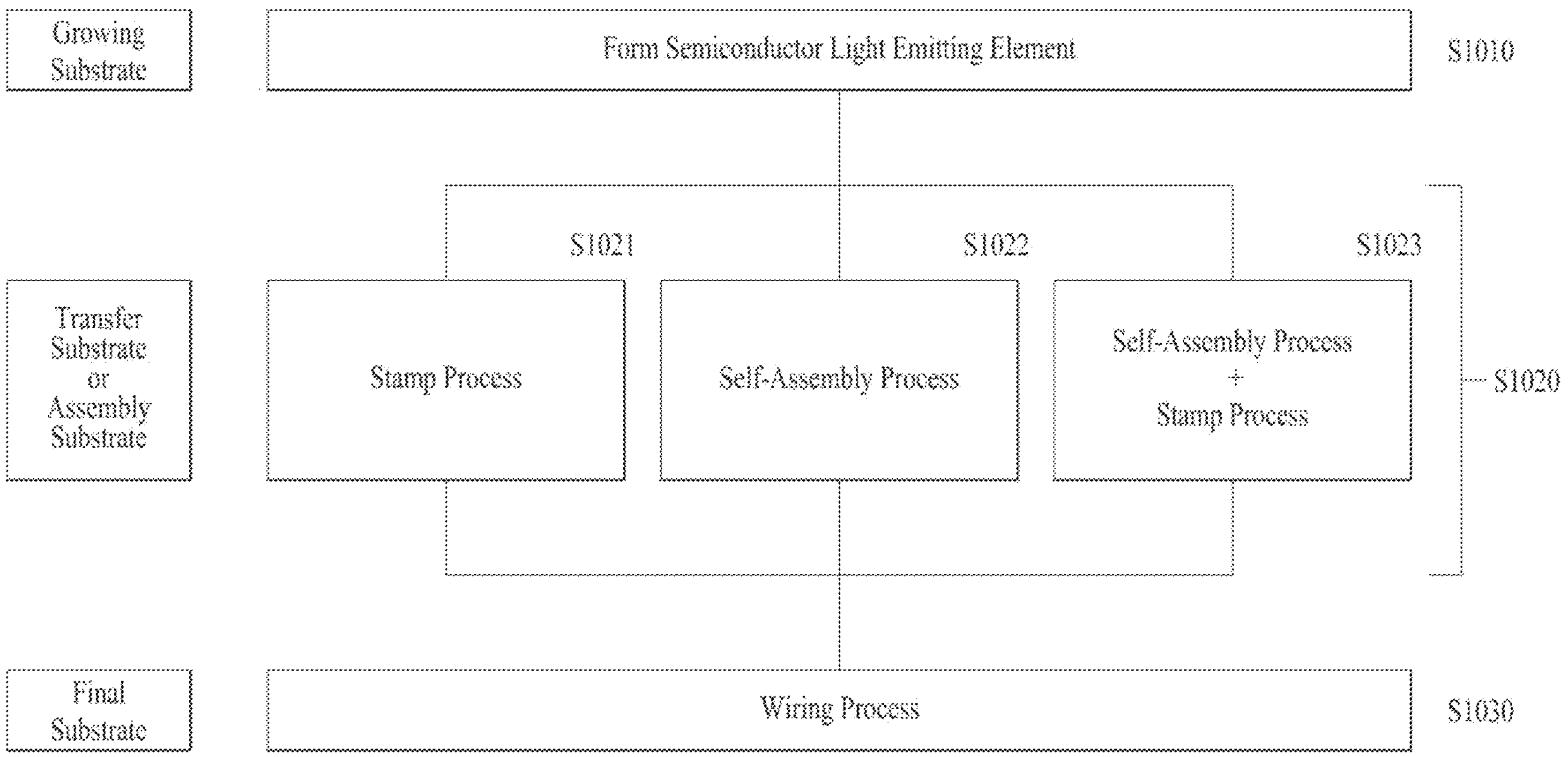
FIG. 10 is a diagram schematically illustrating a method for manufacturing a display device using a semiconductor light emitting element.

FIG. 10 is a diagram schematically illustrating a method for manufacturing a display device using a semiconductor light emitting element.

First, the semiconductor light emitting elements are formed on the growing substrate (S1010). The semiconductor light emitting elements may include a first conductivity type semiconductor layer, an active layer, and a second conductivity type semiconductor layer. In addition, a first conductivity type electrode formed on the first conductivity type semiconductor layer and a second conductivity type electrode formed on the second conductivity type semiconductor layer may be further included.

The semiconductor light emitting elements may be a horizontal type semiconductor light emitting element or the vertical type semiconductor light emitting element. However, in the case of the vertical type semiconductor light emitting element, because the first conductivity type electrode and the second conductivity type electrode face each other, a process of separating the semiconductor light emitting element from the growing substrate and forming a conductivity type electrode in one direction is added in a subsequent process. In addition, as will be described later, the semiconductor light emitting element may include a magnetic layer for a self-assembly process.

In order to utilize the semiconductor light emitting elements in the display device, in general, three types of semiconductor light emitting elements that emit light of colors corresponding to red (R), green (G), and blue (B) are required. Because semiconductor light emitting elements emitting light of one color are formed on one growing substrate, a separate substrate is required for the display device that implements individual unit pixels using the three types of semiconductor light emitting elements. Therefore, individual semiconductor light emitting elements must be separated from the growing substrate and assembled or transferred onto a final substrate. The final substrate is a substrate on which a process of forming a wiring electrode for applying a voltage to the semiconductor light emitting element such that the semiconductor light emitting element may emit light is performed.

Therefore, the semiconductor light emitting elements emitting the light of the respective colors may be transferred back to the final substrate after moving to the transfer substrate or the assembly substrate (S1020). In some cases, when performing the wiring process directly on the transfer substrate or the assembly substrate, the transfer substrate or the assembly substrate serves as the final substrate.

The method (S1020) for disposing the semiconductor light emitting element on the transfer substrate or the assembly substrate may be roughly divided into three types.

A first type is a method (S1021) for moving the semiconductor light emitting element from the growing substrate to the transfer substrate by the stamp process. The stamp process refers to a process of separating the semiconductor light emitting element from the growing substrate through a protrusion using a substrate that is made of a flexible material and having the adhesive protrusion. By adjusting a spacing and an arrangement of the protrusions, the semiconductor light emitting element of the growing substrate may be selectively separated.

A second type is a method (S1022) for assembling the semiconductor light emitting element onto the assembly substrate using the self-assembly process. For the self-assembly process, the semiconductor light emitting element must exist independently by being separated from the growing substrate, so that the semiconductor light emitting elements are separated from the growing substrate through a laser lift-off (LLO) process or the like as much as the required number of semiconductor light emitting elements. Thereafter, the semiconductor light emitting elements are dispersed in a fluid and assembled onto the assembly substrate using an electromagnetic field.

The self-assembly process may simultaneously assemble the semiconductor light emitting elements that respectively implement the R, G, and B colors on one assembly substrate, or assemble the semiconductor light emitting element of the individual color through an individual assembly substrate.

A third type is a method (S1023) for mixing the stamp process and the self-assembly process. First, the semiconductor light emitting elements are placed on the assembly substrate through the self-assembly process, and then the semiconductor light emitting elements are moved to the final substrate through the stamp process. In the case of the assembly substrate, because it is difficult to implement the assembly substrate in a large area due to a location of the assembly substrate during the self-assembly process, a contact with the fluid, an influence of the electromagnetic fields, or the like, a process of transferring the semiconductor light emitting elements to the final substrate of a large area after assembling the semiconductor light emitting elements using an assembly substrate of an appropriate area may be performed several times with the stamp process.

When a plurality of semiconductor light emitting elements constituting the individual unit pixel are placed on the final substrate, the wiring process for electrically connecting the semiconductor light emitting elements to each other is performed (S1030).

The wiring electrode formed through the wiring process electrically connects the semiconductor light emitting elements assembled or transferred onto the substrate to the substrate. In addition, a transistor for driving an active matrix may be previously formed beneath the substrate. Accordingly, the wiring electrode may be electrically connected to the transistor.

In one example, innumerable semiconductor light emitting elements are required for a large-area display device, so that the self-assembly process is preferable. In order to further improve an assembly speed, among the self-assembly processes, it may be preferred that the semiconductor light emitting elements of the respective colors are simultaneously assembled onto one assembly substrate. In addition, in order for the semiconductor light emitting elements of the respective colors to be assembled at predetermined specific positions on the assembly substrate, it may be required for the semiconductor light emitting elements to have a mutually exclusive structure.

Figure 11:
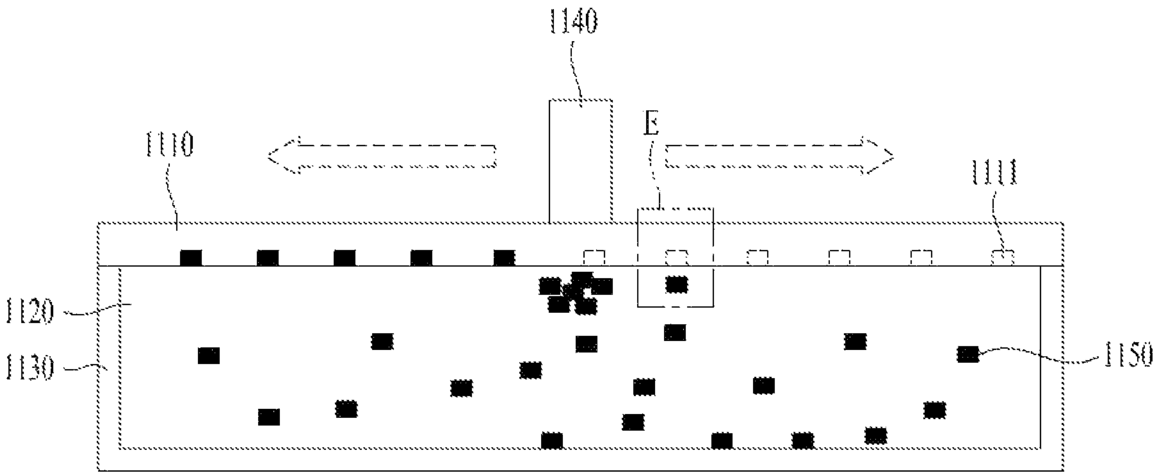
FIG. 11 is a diagram showing one embodiment of a method for assembling a semiconductor light emitting element onto a substrate by a self-assembly process.

FIG. 11 is a diagram showing one embodiment of a method for assembling a semiconductor light emitting element onto a substrate by a self-assembly process.

Figure 12:
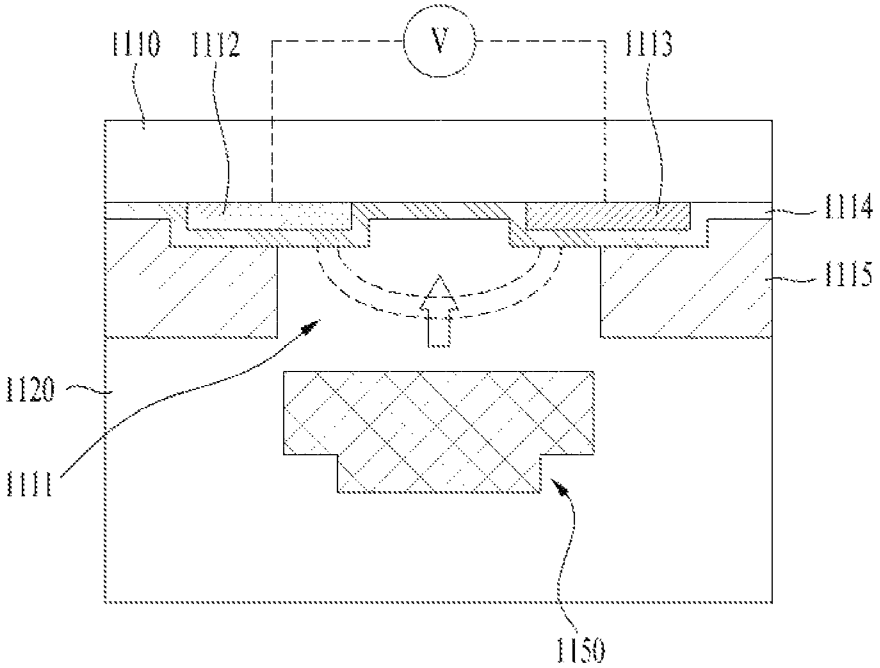
FIG. 12 is an enlarged view of a portion E in FIG. 11.

FIG. 12 is an enlarged view of a portion E in FIG. 11.

Referring to FIGS. 11 and 12, a semiconductor light emitting element 1150 may be input into a chamber 1130 filled with a fluid 1120.

Thereafter, the assembly substrate 1110 may be disposed on the chamber 1130. According to an embodiment, the assembly substrate 1110 may be introduced into the chamber 1130. In this regard, a direction in which the assembly substrate 1110 is introduced is a direction in which an assembly groove 1111 of the assembly substrate 1110 faces the fluid 1120.

A pair of electrodes 1112 and 1113 corresponding to each semiconductor light emitting element 1150 to be assembled may be formed on the assembly substrate 1110. The electrodes 1112 and 1113 may be implemented as transparent electrodes (ITO) or may be implemented using other common materials. The electrodes 1112 and 1113 correspond to assembly electrodes that stably fix the semiconductor light emitting element 1150 in contact with the assembly electrodes 1112 and 1113 by generating an electric field as a voltage is applied thereto.

Specifically, an alternating voltage may be applied to the electrodes 1112 and 1113, and the semiconductor light emitting element 1150 floating around the electrodes 1112 and 1113 may have a polarity by dielectric polarization. In addition, the dielectrically polarized semiconductor light emitting element may be moved in a specific direction or fixed by a non-uniform electric field formed around the electrodes 1112 and 1113. This is referred to as dielectrophoresis. In a self-assembly process of the present disclosure, the semiconductor light emitting element 1150 may be stably fixed into the assembly groove 1111 using the dielectrophoresis.

In addition, a spacing between the assembly electrodes 1112 and 1113 may be, for example, smaller than a width of the semiconductor light emitting element 1150 and a diameter of the assembly groove 1111, so that an assembly position of the semiconductor light emitting element 1150 using the electric field may be more precisely fixed.

In addition, an assembly insulating layer 1114 may be formed on the assembly electrodes 1112 and 1113 to protect the electrodes 1112 and 1113 from the fluid 1120 and to prevent leakage of current flowing through the assembly electrodes 1112 and 1113. For example, the assembled insulating film 1114 may be composed of a single layer or multiple layers of an inorganic insulator such as silica or alumina or an organic insulator. In addition, the assembly insulating layer 1114 may have a minimum thickness for preventing damage to the assembly electrodes 1112 and 1113 when assembling the semiconductor light emitting element 1150 and may have a maximum thickness for stably assembling the semiconductor light emitting element 1150.

A partition wall 1115 may be formed on the assembly insulating layer 1114. A partial region of the partition wall 1115 may be located above the assembly electrodes 1112 and 1113, and the remaining region thereof may be located above the assembly substrate 1110.

For example, when manufacturing the assembly substrate 1110, as a portion of the partition wall formed on the entire assembly insulating layer 1114 is removed, the assembly groove 1111 in which each of the semiconductor light emitting elements 1150 is coupled to the assembly substrate 1110 may be defined.

As shown in FIG. 12, the assembly groove 1111 into which the semiconductor light emitting element 1150 is coupled may be defined in the assembly substrate 1110 and a surface in which the assembly groove 1111 is defined may be in contact with the fluid 1120. The assembly groove 1111 may guide the accurate assembly position of the semiconductor light emitting element 1150.

In addition, the partition wall 1115 may be formed to have a certain inclination from an opening of the assembly groove 1111 toward a bottom surface. For example, by adjusting the inclination of the partition wall 1115, the assembly groove 1111 may have the opening and the bottom surface and an area of the opening may be larger than an area of the bottom surface. Accordingly, the semiconductor light emitting element 1150 may be assembled at an accurate position on the bottom surface of the assembly groove 1111.

The assembly groove 1111 may have a shape and a size corresponding to those of the semiconductor light emitting element 1150 to be assembled. Accordingly, it is possible to prevent other semiconductor light emitting elements from being assembled into the assembly groove 1111 or to prevent a plurality of semiconductor light emitting elements from being assembled into the assembly groove 1111.

In addition, a depth of the assembly groove 1111 may be smaller than a vertical height of the semiconductor light emitting element 1150. Therefore, the semiconductor light emitting element 1150 may have a structure protruding to a portion between the portions of the partition walls 1115, and may easily come into contact with a protrusion of the transfer substrate during a transfer process that may occur after the assembly.

In addition, as shown in FIG. 12, after the assembly substrate 1110 is disposed, an assembly apparatus 1140 containing a magnetic body may move along the assembly substrate 1110. The assembly apparatus 1140 may move in contact with the assembly substrate 1110 in order to maximize a region of a magnetic field into the fluid 1120. For example, the assembly apparatus 1140 may contain a plurality of magnetic bodies or may contain a magnetic body of a size corresponding to that of the assembly substrate 1110. In this case, a moving distance of the assembly apparatus 1140 may be limited to be in a predetermined range.

The semiconductor light emitting element 1150 in the chamber 1130 may move toward the assembly apparatus 1140 by the magnetic field generated by the assembly apparatus 1140.

While moving toward the assembly apparatus 1140, the semiconductor light emitting element 1150 may enter the assembly groove 1111 and come into contact with the assembly substrate 1110, as shown in FIG. 12.

In addition, the semiconductor light emitting element 1150 may include a magnetic layer therein such that the self-assembly process may be performed.

The semiconductor light emitting element 1150 in contact with the assembly substrate 1110 may be prevented from deviating by the movement of the assembly device 1140 because of the electric field generated by the assembly electrodes 1112 and 1113 of the assembly substrate 1110.

Accordingly, the plurality of semiconductor light emitting elements 1150 are simultaneously assembled to the assembly substrate 1110 in the self-assembly method using the electromagnetic field shown in FIGS. 11 and 12.

Figure 13:
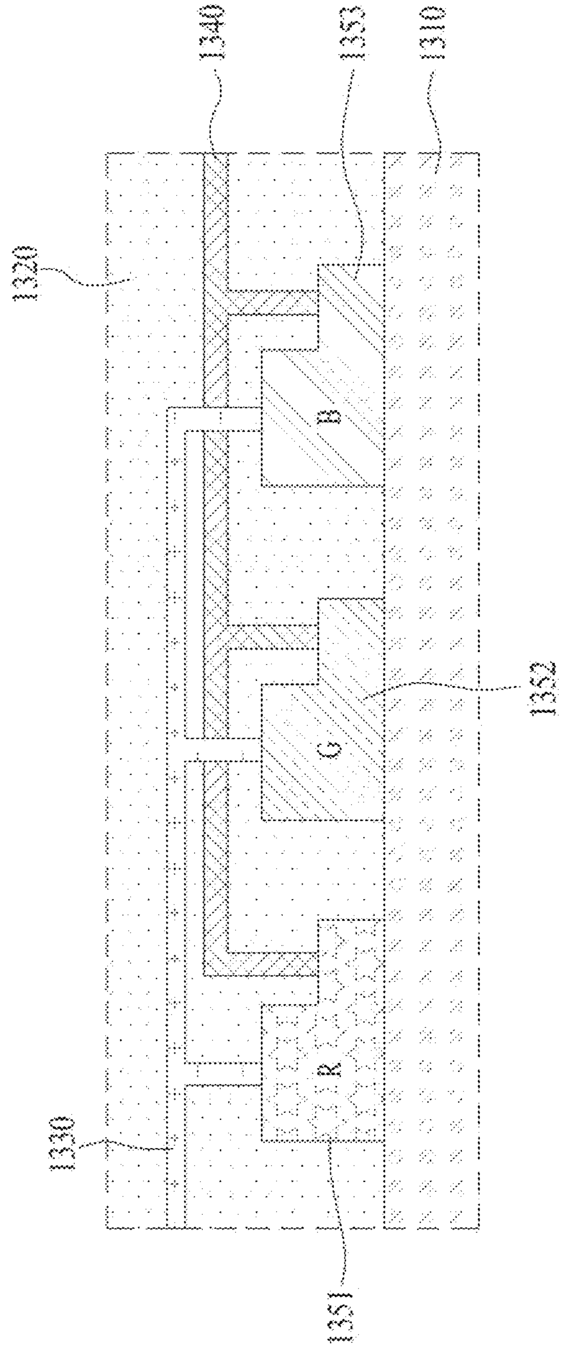
FIG. 13 is a diagram showing a unit pixel of a display device to be formed using a red semiconductor light emitting element according to the present disclosure.

FIG. 13 is a diagram showing a unit pixel of a display device to be formed using a red semiconductor light emitting element according to the present disclosure.

As shown in FIG. 13, a red (R) semiconductor light emitting element 1351, a green (G) semiconductor light emitting element 1352, and a blue (B) semiconductor light emitting element 1353 may be arranged on a substrate 1310. The semiconductor light emitting elements 1351, 1352, and 1353 may each be a horizontal-type semiconductor light emitting element with conductive electrodes formed on one surface thereof. The conductive electrodes may be connected to wire electrodes, respectively. For example, a first conductive electrode connected to a first conductive semiconductor layer may be electrically connected to a first wire electrode 1330, and a second conductive electrode connected to a second conductive semiconductor layer may be electrically connected to a second wire electrode 1340. An interlayer insulating layer 1320 may be formed between the semiconductor light emitting elements 1351, 1352, and 1353 and the wire electrodes 1330 and 1340 to prevent unintentional electrical connection between devices.

In order to apply the semiconductor light emitting elements 1351, 1352, and 1353 of various colors shown in FIG. 13 to a high-resolution display device, the size of each semiconductor light emitting element needs to be manufactured at the level of micrometers. For example, in the case of a horizontal-type semiconductor light emitting element, in consideration of an image quality level of the currently commercialized display device, the device needs a diameter of several tens of μm and a height of several μm. The height of the device may be formed to be larger than the above-mentioned several μm, but epitaxial growth to improve the height of the device requires a lot of manufacturing cost, and thus it may be limit the height of the device at a level for ensuring the light emitting performance of the device. When the height of the device is too small compared with the diameter of the device, the device may not emit light even when a voltage is applied thereto, and thus the height of the device compared with the diameter thereof needs to be adjusted at an appropriate level.

Each semiconductor light emitting element may be formed on each growth substrate and may be selectively transferred or separated, thereby reducing manufacturing cost. For example, as described above with reference to FIG. 10, a stamp process (or pick-and-place) and a laser lift-off (LLO) process may be used for the transfer or separation method.

A green semiconductor light emitting element or a blue semiconductor light emitting element may be manufactured using a sapphire substrate as a growth substrate, but in the case of a red semiconductor light emitting element, the device may be manufactured on a GaAs substrate. In particular, the red semiconductor light emitting element grown from GaAs may be easily damaged compared to semiconductor light emitting elements of different colors.

Therefore, in a self-assembly process, chips without damage need to be arranged in an assembly groove, and there is a very high possibility that, for example, a damaged red semiconductor light emitting element is arranged in the assembly groove. A specific solution for resolving this problem will be described below in detail with reference to FIGS. 14 to 20.

Figure 14:
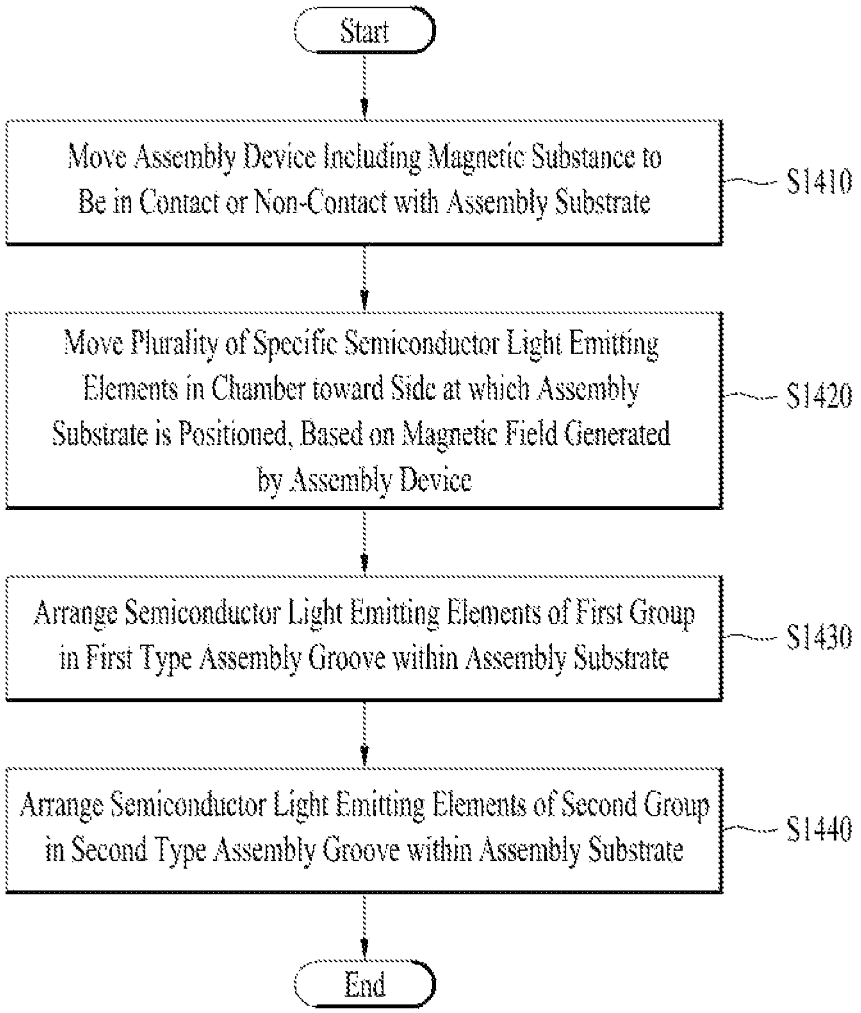
FIG. 14 is a flowchart showing a process of separating and assembling a defective chip according to an embodiment of the present disclosure.

FIG. 14 is a flowchart showing a process of separating and assembling a defective chip according to an embodiment of the present disclosure.

First, according to an embodiment of the present disclosure, an assembly device including a magnetic substance may be moved to be in contact or non-contact with an assembly substrate (S1410). A chamber filled with a fluid may be positioned below the assembly device and the assembly substrate, and a plurality of specific semiconductor light emitting elements may be contained in the chamber. The self-assembly process has been described above in detail with reference to FIG. 11, and thus FIG. 14 may be supplementally interpreted by those skilled in the art with reference to FIG. 11.

According to an embodiment of the present disclosure, based on a magnetic field generated by the assembly device, the plurality of specific semiconductor light emitting elements in the chamber may be moved toward a side at which the assembly substrate is positioned (S1420).

According to an embodiment of the present disclosure, among the plurality of specific semiconductor light emitting elements, semiconductor light emitting elements of a first group (e.g., semiconductor light emitting elements with a normal size without damage) may be arranged in a first type assembly groove in the assembly substrate (S1430). According to an embodiment of the present disclosure, among the plurality of specific semiconductor light emitting elements, semiconductor light emitting elements of a second group (e.g., semiconductor light emitting elements with a smaller size than the normal size due to damage) may be arranged in a second type assembly groove in the assembly substrate (S1440). In particular, the second type assembly groove may be designed different from the first type assembly groove, and thus it may be possible to selectively recover only defective chips.

All of the plurality of specific semiconductor light emitting elements shown in FIG. 14 may be limited to, for example, a fragile red chip manufactured based on GaAs. The assembly substrate shown in FIG. 14 may be, for example, a donor substrate functioning as an intermediate substrate or a final display substrate.

That is, as shown in FIG. 14, an embodiment of the present disclosure may provide a substrate with a groove (or a well) for separating damaged chips as well as a groove (or well) for assembly on a display substrate or donor substrate for assembling RGB, and thus only defective chips may be advantageously recovered before final substrate assembly, thereby improving an assembly rate.

However, according to an embodiment of the present disclosure, not only a groove for assembling a normal chip but also a groove (however, the groove is also referred to as a well but they have the same meaning throughout the specification) for recovering a defective chip may be present on one substrate together, which will be described in detail with reference to FIG. 15 below.

In contrast, according to another embodiment of the present disclosure, it may be possible to manufacture a dedicated substrate for recovering defective chips, which will be described in detail with reference to FIG. 16 below.

Figure 15:
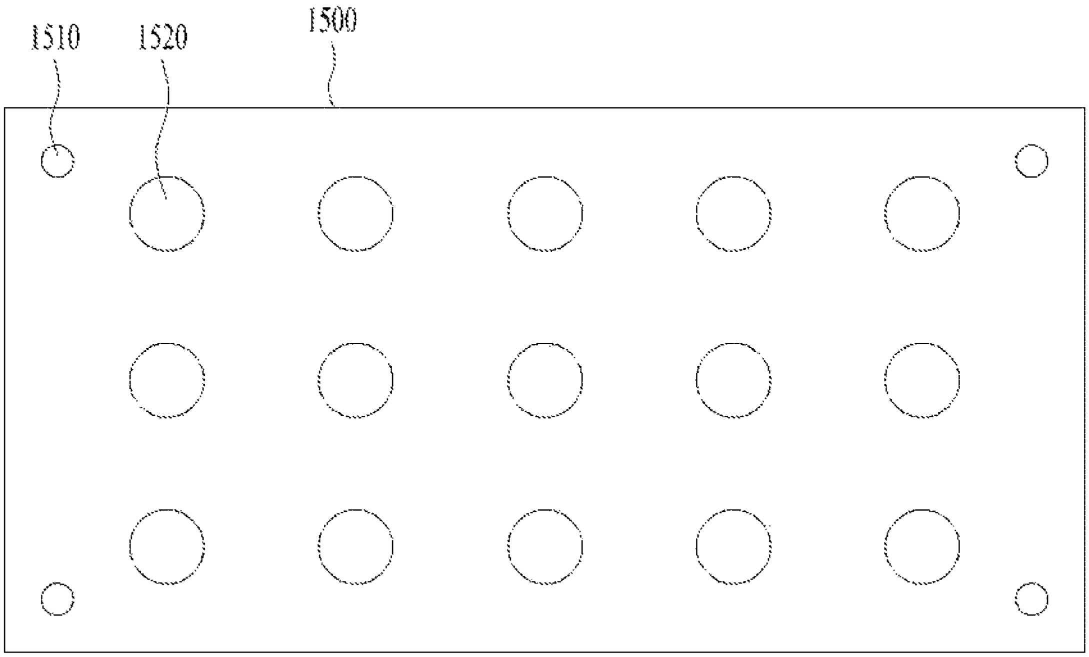
FIG. 15 is a diagram showing a substrate including both a first type assembly groove and a second type assembly groove according to an embodiment of the present disclosure.

FIG. 15 is a diagram showing a substrate including both a first type assembly groove and a second type assembly groove according to an embodiment of the present disclosure.

As shown in FIG. 15, an assembly substrate 1500 may include a first type assembly groove 1510 for a first group corresponding to normal semiconductor light emitting elements and may also include a second type assembly groove 1520 for a second group corresponding to damaged semiconductor light emitting elements. In particular, a radius of the second type assembly groove 1520 may be designed to be smaller than a radius of the first type assembly groove 1510, and thus the semiconductor light emitting elements of the first group may not be arranged in the second type assembly groove 1520, and only the semiconductor light emitting elements of the second group may be arranged in the second type assembly groove 1520. Accordingly, only defective chips belonging to the second group may be advantageously recovered.

Figure 16:
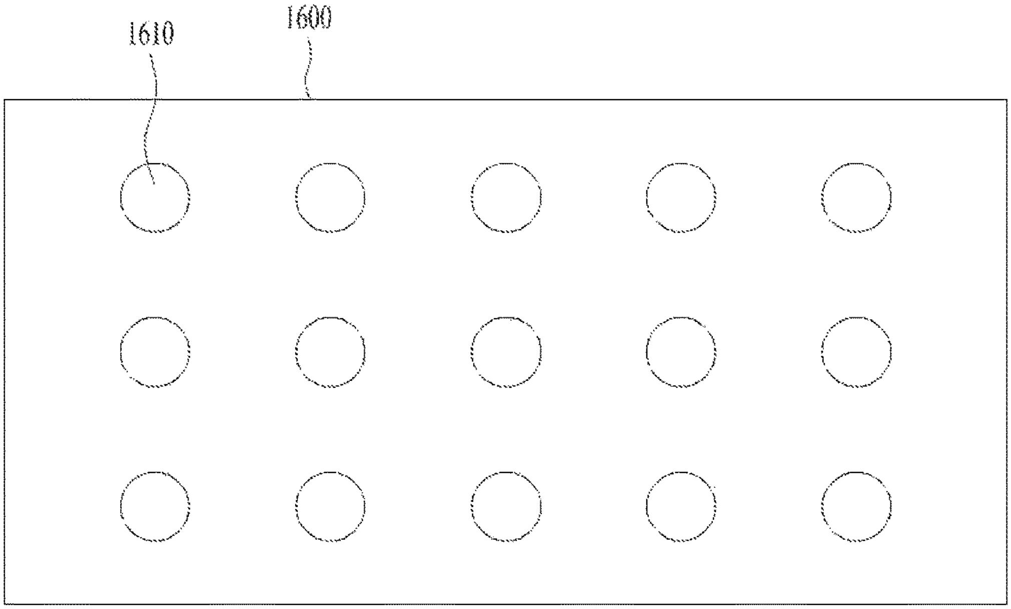
FIG. 16 is a diagram showing a separate substrate with only a first type assembly groove and a separate substrate with only a second type assembly groove according to an embodiment of the present disclosure.
Figure 16:
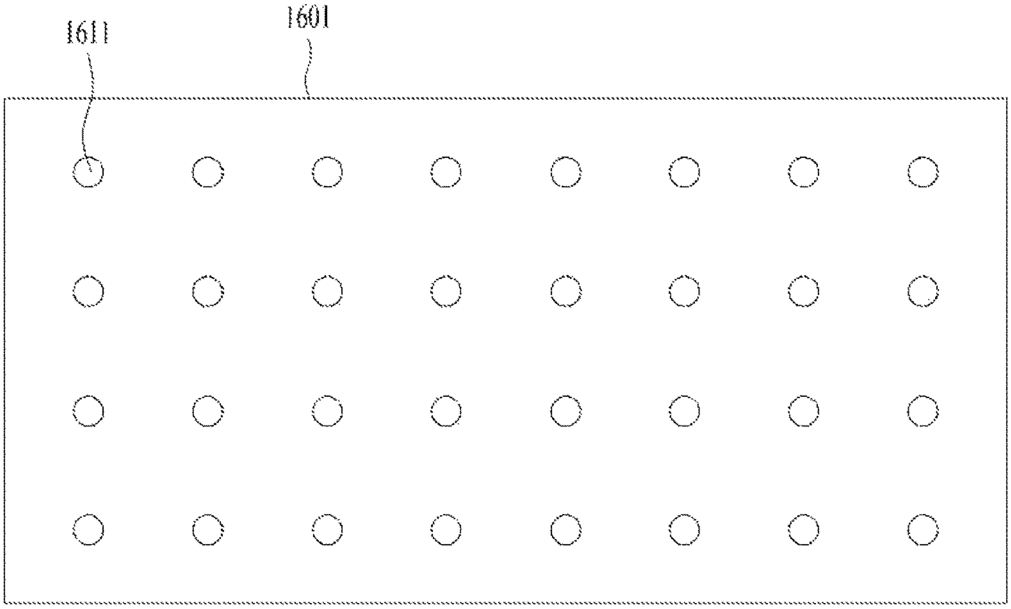

FIG. 16 is a diagram showing a separate substrate with only a first type assembly groove and a separate substrate with only a second type assembly groove according to an embodiment of the present disclosure.

Differently from FIG. 15, FIG. 16 provides a separate substrate for recovering a defective chip. For example, as shown in FIG. 16B, a substrate 1601 having a small assembly groove 1611 for a defective chip may be positioned on a chamber used in the self-assembly process shown in FIG. 11. Normal chips may have a relatively large size than the assembly groove 1611, and thus may not be arranged in the assembly groove 1611, and only defective chips with a reduced size due to physical damage may be arranged in the assembly groove 1611.

When this process is performed, defective chips with a reduced size due to physical damage may not be present in the chamber. Then, as shown in FIG. 16(*a*), when a substrate 1600 having only an assembly groove 1610 for a normal chip may be positioned above the chamber and the self-assembly process is performed, only normal chips may be advantageously arranged in the corresponding assembly groove 1610.

Although only the size of the assembly groove for a defective chip has been described with reference to FIGS. 15 and 16, the assembly electrode may also be designed differently from an assembly electrode applied to the assembly groove for a normal chip, which will be described in detail with reference to FIGS. 17 and 18 below.

Figure 17:
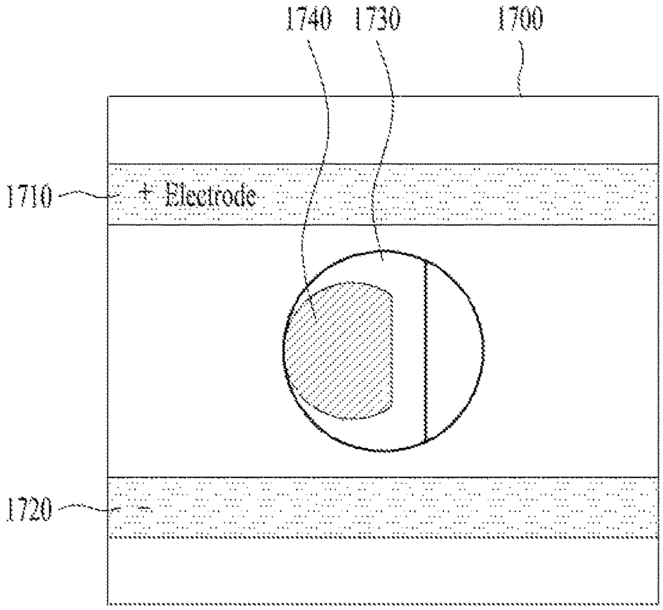
FIG. 17 is a diagram showing the structure of a second type assembly groove and arrangement of an assembly electrode for the second type assembly groove according to an embodiment of the present disclosure.

FIG. 17 is a diagram showing the structure of a second type assembly groove and arrangement of an assembly electrode for the second type assembly groove according to an embodiment of the present disclosure. As illustrated in the previous drawings, the second type assembly groove stated in this specification is for a defective chip.

As shown in FIG. 17, an assembly groove 1730 for a defective chip in an assembly substrate 1700 may be designed to have a smaller size than an assembly groove (refer to FIG. 18) for a normal chip or may be designed to have the same overall size as the assembly groove for a normal chip but to have a grid type, and thus only a defective chip 1740 may be arranged in the assembly groove 1730 and a normal chip may not be arranged therein.

As described above with reference to FIGS. 11 and 12, based on dielectrophoresis, the semiconductor light emitting element needs to be stably fixed in the assembly groove. However, a defective chip (for example, a defective semiconductor light emitting element with a reduced size due to physical damage compared to a normal semiconductor light emitting element) may have a relatively small size, and thus it may be experimentally seen that it is possible to fix the defective chip to the assembly groove simply using small dielectrophoresis (DEP) force.

Figure 18:
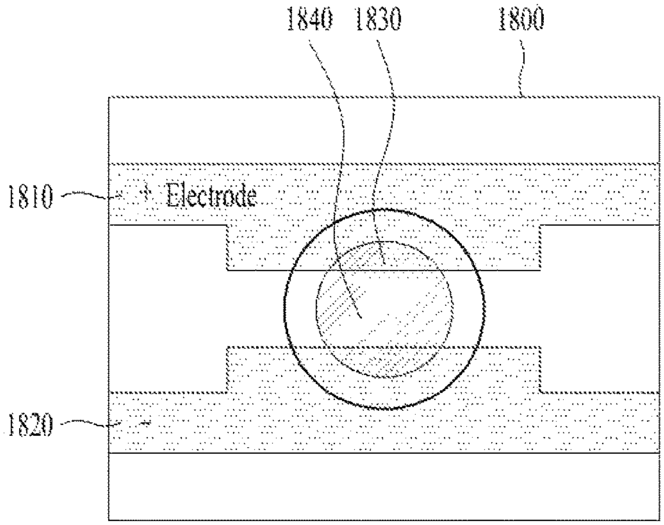
FIG. 18 is a diagram showing the structure of a first type assembly groove and arrangement of an assembly electrode for the first type assembly groove according to an embodiment of the present disclosure.

It may be sufficient that the assembly electrodes 1710 and 1720 are formed at a boundary of the assembly groove 1730, and there is no need to design the assembly electrodes 1710 and 1720 to overlap the assembly groove as shown in FIG. 18. This design may provide a technical effect of simplifying the assembly electrode for a defective chip, thereby simplifying the overall structure and minimizing related power consumption.

FIG. 18 is a diagram showing the structure of a first type assembly groove and arrangement of an assembly electrode for the first type assembly groove according to an embodiment of the present disclosure. As illustrated in the previous drawings, the first type assembly groove stated in this specification is for a normal chip (i.e., a chip that is not physically damaged to have a normal size).

Compared with FIG. 17, a substrate 1800 shown in FIG. 18 may include a larger assembly groove 1830 than the size of a normal chip 1840 to position the normal chip 1840 on the assembly groove 1830.

Differently from FIG. 17, the assembly groove 1830 and assembly electrodes 1810 and 1820 may be designed to overlap each other, and relatively large dielectrophoresis (DEP) force may be generated. Thus, the normal chip 1840 with a larger size than a defective chip may be stably fixed to the assembly groove 1830.

That is, according to another embodiment of the present disclosure, arrangement of an assembly electrode for the first type assembly groove (for a normal chip) may be different from arrangement of an assembly electrode for the second type assembly groove (for a defective chip with a reduced size due to damage).

In particular, the assembly electrode for the first type assembly groove may partially overlap the first type assembly groove to generate first dielectrophoresis (DEP) force, but the assembly electrode for the second type assembly groove may not partially overlap the second type assembly groove to generate second DEP force. The second DEP force may be smaller than the first DEP force.

Thus, only a defective chip may be selectively filtered using a relatively small assembly electrode and DEP force.

Hereinafter, various embodiments of an assembly groove for a defective chip will be described with reference to drawings.

Figure 19:
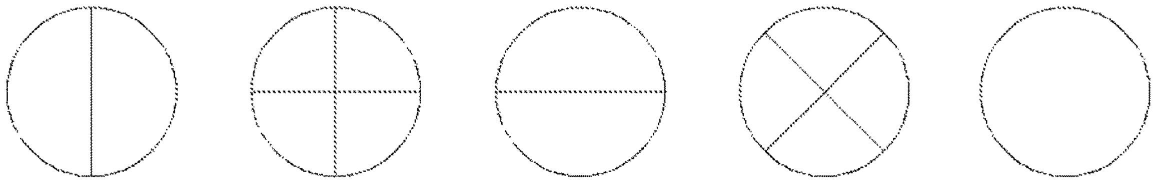
FIG. 19 is a diagram showing another embodiment of the second type assembly groove shown in FIG. 17.

FIG. 19 is a diagram showing another embodiment of the second type assembly groove shown in FIG. 17.

An assembly groove shown in FIG. 19(*e*) may correspond to a first type for a normal semiconductor light emitting element. In contrast, assembly grooves shown in FIGS. 19(*a*) to 19(*d*) may be of a second type and may be for recovery of a defective chip that is damaged to have a relative small size but not a normal semiconductor light emitting element.

The second type assembly grooves shown in FIGS. 19(*a*) to 19(*d*) may have the same radius as a first type assembly groove (FIG. 19(*e*)), but may have various grid patterns in a groove. Thus, chips that are not damaged to have a normal size may not be arranged.

Figure 20:
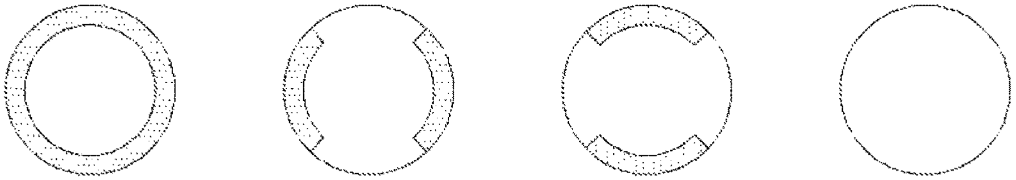
FIG. 20 is a diagram showing another embodiment of the second type assembly groove shown in FIG. 17.

FIG. 20 is a diagram showing another embodiment of the second type assembly groove shown in FIG. 17.

An assembly groove shown in FIG. 20(*d*) may correspond to a first type for a normal semiconductor light emitting element. In contrast, assembly grooves shown in FIGS. 20(*a*) to 20(*c*) may be of a second type and may be for recovery of a defective chip that is damaged to have a relative small size but not a normal semiconductor light emitting element.

Differently from FIG. 19, a grid pattern may not be used in FIG. 20. As shown in FIG. 20(*a*), the assembly groove may be designed to have a smaller radius, and as shown in FIG. 20(*b*), the assembly groove may be designed to place barriers on right and left sides and thus a normal chip is not arranged therein. As shown in FIG. 20(*c*), it may be possible to design the assembly groove to place barriers on upper and lower sides.

The assembly groove may be designed to recover all of defective chips having various shapes using at least a plurality of patterns rather than using only one of the various assembly grooves shown in FIGS. 19 and 20, which may also belong to the scope of the present disclosure.

Needless to say, although FIGS. 19 and 20 illustrate the case in which a chip is circular, the technical idea according to the present disclosure may also be applied to chips having other shapes.

Although a chip (a semiconductor light emitting element) mainly uses a magnet for movement within a chamber in previous drawings, the present disclosure is not limited thereto. For example, a water gun, ultrasonic wave, or droplet for creating a flow in a fluid in the chamber may also be used.

As a method of recovering defective chips arranged in an assembly groove of a substrate of a substrate, a method of absorbing and recovering a defective chip by a transfer head may be used. In addition, a method such as vacuum, a magnetic field, or an electrostatic method may also be used.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

The invention claimed is:

1. A display device related to a micro light emitting diode (micro-LED), the display device comprising:

an assembly substrate including a first type assembly groove and a first assembly electrode for the first type assembly groove, and a second type assembly groove and a second assembly electrode for the second type assembly groove, the second type assembly groove having a different size or structure from the first type assembly groove, wherein:

semiconductor light emitting elements of a first group among a plurality of specific semiconductor light emitting elements are arranged in the first type assembly groove within the assembly substrate; and semiconductor light emitting elements of a second group among the plurality of specific semiconductor light emitting elements are arranged in the second type assembly groove within the assembly substrate, and wherein the first assembly electrode and the second assembly electrode are disposed in different positional relationships relative to the first type assembly groove and the second type assembly groove, respectively, to induce a first dielectrophoresis (DEP) force at the first type assembly groove that is greater than a second DEP force at the second type assembly groove.

2. The display device of claim 1, wherein a radius of the second type assembly groove is smaller than a radius of the first type assembly groove.

3. The display device of claim 2, wherein the radius of the second type assembly groove is smaller than the radius of the first type assembly groove due to presence of at least one barrier.

4. The display device of claim 3, wherein the at least one barrier is formed in an annular shape.

5. The display device of claim 4, wherein the at least one barrier is formed in a pair disposed on opposite sides of the second type assembly groove.

6. The display device of claim 1, wherein the semiconductor light emitting elements of the first group are not arranged in the second type assembly groove, and the semiconductor light emitting elements of the second group are arranged in the second type assembly groove.

7. The display device of claim 1, wherein:

the first assembly electrode for the first type assembly groove partially overlaps the first type assembly groove; and the second assembly electrode for the second type assembly groove does not overlap the second type assembly groove.

8. The display device of claim 7, wherein all of the plurality of specific semiconductor light emitting elements is a red chip manufactured based on GaAs.

9. The display device of claim 1, wherein the assembly substrate is a donor substrate or a final display substrate.

10. The display device of claim 1, wherein the second type assembly groove has the same radius as the first type assembly groove, and has a grid pattern therein.

11. A display device containing a micro light emitting diode (micro-LED), the display device comprising:

an assembly substrate including a first type assembly groove and a first assembly electrode for the first type assembly groove, and a second type assembly groove and a second assembly electrode for the second type assembly groove;

a first group of semiconductor light emitting elements located in the first type assembly groove within the assembly substrate; and a second group of semiconductor light emitting elements located in the second type assembly groove, wherein a size of the first group of semiconductor light emitting elements is different from a size of the second group of semiconductor light emitting elements, and wherein the first assembly electrode and the second assembly electrode are disposed in different positional relationships relative to the first type assembly groove and the second type assembly groove, respectively, to induce a first dielectrophoresis (DEP) force at the first type assembly groove that is greater than a second DEP force at the second type assembly groove.

12. The display device of claim 11, wherein the first type assembly groove and the second type assembly groove have a different size or shape from each other.

13. The display device of claim 11, wherein the size of the first group of semiconductor light emitting elements is greater than the size of the second group of semiconductor light emitting elements.

* * * * *